United States Patent
Kondo et al.

(10) Patent No.: US 9,219,015 B2
(45) Date of Patent: Dec. 22, 2015

(54) PHOSPHOR LAYER-COVERED OPTICAL SEMICONDUCTOR ELEMENT, PRODUCING METHOD THEREOF, OPTICAL SEMICONDUCTOR DEVICE, AND PRODUCING METHOD THEREOF

(71) Applicant: NITTO DENKO CORPORATION, Ibaraki-shi, Osaka (JP)

(72) Inventors: Takashi Kondo, Osaka (JP); Hiroyuki Katayama, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 84 days.

(21) Appl. No.: 14/068,585

(22) Filed: Oct. 31, 2013

(65) Prior Publication Data
US 2014/0131752 A1 May 15, 2014

(30) Foreign Application Priority Data
Nov. 9, 2012 (JP) .................................. 2012-247598

(51) Int. Cl.
*H01L 33/50* (2010.01)
*H01L 21/66* (2006.01)

(52) U.S. Cl.
CPC ................ *H01L 22/24* (2013.01); *H01L 33/50* (2013.01); *H01L 33/507* (2013.01); *H01L 2924/0002* (2013.01); *H01L 2933/0041* (2013.01)

(58) Field of Classification Search
CPC .................................................... H01L 33/0091
See application file for complete search history.

(56) References Cited

U.S. PATENT DOCUMENTS
2007/0096131 A1   5/2007   Chandra

FOREIGN PATENT DOCUMENTS
JP   2007-123915 A   5/2007

*Primary Examiner* — Cheung Lee
(74) *Attorney, Agent, or Firm* — Sughrue Mion, PLLC

(57) ABSTRACT

A method for producing a phosphor layer-covered optical semiconductor element includes a step of opposing a phosphor layer containing a phosphor to an optical semiconductor element and an adjusting step of adjusting a color tone of light emitted from the optical semiconductor element and exited via the phosphor layer by adjusting the thickness of the phosphor layer.

4 Claims, 6 Drawing Sheets

PHOSPHOR LAYER-COVERED OPTICAL SEMICONDUCTOR ELEMENT, PRODUCING METHOD THEREOF, OPTICAL SEMICONDUCTOR DEVICE, AND PRODUCING METHOD THEREOF

CROSS-REFERENCE TO RELATED APPLICATION

The present application claims priority from Japanese Patent Application No. 2012-247598 filed on Nov. 9, 2012, the contents of which are hereby incorporated by reference into this application.

BACKGROUND OF THE INVENTION

1. Field of the Invention

The present invention relates to a phosphor layer-covered optical semiconductor element, a producing method thereof, an optical semiconductor device, and a producing method thereof, to be specific, to a method for producing a phosphor layer-covered optical semiconductor element preferably used for an optical use, a phosphor layer-covered optical semiconductor element obtained by the method, a method for producing an optical semiconductor device using the phosphor layer-covered optical semiconductor element, and an optical semiconductor device obtained by the method.

2. Description of Related Art

An optical semiconductor element is obtained by being cut from one wafer into a plurality of pieces. The optical semiconductor element is mounted on a board to be further covered with a phosphor layer, so that an optical semiconductor device is produced.

As a method for obtaining an optical semiconductor device using an optical semiconductor element, for example, the following method has been proposed (ref: for example, Japanese Unexamined Patent Publication No. 2007-123915).

That is, a dominant wavelength (a wavelength obtained by adding a visibility curve to an emission spectrum) of radiated lights of a plurality of LEDs cut from a wafer is measured. Then, a plurality of the LEDs are classified into groups in accordance with the range of the dominant wavelength, to be specific, a group consisting of 440 and 445 nm, a group consisting of 445 and 450 nm, a group consisting of 450 and 455 nm, and a group consisting of 455 and 460 nm and each of the LEDs of the groups is mounted on the respective boards. Separately, a plurality of phosphor sheets each containing a phosphor with a concentration that corresponds to the dominant wavelength are prepared. Next, each of the phosphor sheets with a phosphor concentration that corresponds to the dominant wavelength of the group is deposited on the board and the LED to be then cured by heating.

In Japanese Unexamined Patent Publication No. 2007-123915, the phosphor sheet with a phosphor concentration that corresponds to the dominant wavelength of the LED is deposited on the corresponding LED, so that a desired color tone (a desired degree of whiteness) is obtained.

SUMMARY OF THE INVENTION

In the method in Japanese Unexamined Patent Publication No. 2007-123915, however, there is a disadvantage that a plurality of types of the phosphor sheets each having a different phosphor concentration are required to be prepared in advance corresponding to the LEDs each having a different dominant wavelength and thus, the number of steps are increased.

Furthermore, there is also a disadvantage that the phosphor concentration that corresponds to each of the dominant wavelengths is determined, so that the steps are complicated.

It is an object of the present invention to provide a method for producing a phosphor layer-covered optical semiconductor element in which a plurality of types of phosphor layers each having a different phosphor concentration are not required to be prepared even when a plurality of optical semiconductor elements have different dominant wavelengths and furthermore, a phosphor layer corresponding to a color tone to be aimed at is capable of being easily formed, a phosphor layer-covered optical semiconductor element obtained by the method, a method for producing an optical semiconductor device using the phosphor layer-covered optical semiconductor element, and an optical semiconductor device obtained by the method.

A method for producing a phosphor layer-covered optical semiconductor element of the present invention includes a step of opposing a phosphor layer containing a phosphor to an optical semiconductor element and an adjusting step of adjusting a color tone of light emitted from the optical semiconductor element and exited via the phosphor layer by adjusting the thickness of the phosphor layer.

This method includes the adjusting step of adjusting the color tone of the light emitted from the optical semiconductor element and exited via the phosphor layer by adjusting the thickness of the phosphor layer. Thus, by an easy method of adjusting the thickness of the phosphor layer, the number of parts by mass of the phosphor per unit area in the phosphor layer, to be specific, a basis weight of the phosphor in the phosphor layer is capable of being adjusted so as to correspond to the color tone to be aimed at. Therefore, as in Japanese Unexamined Patent Publication No. 2007-123915, it is not required that a plurality of the phosphor layers each having a different phosphor concentration are prepared in advance and of those, the phosphor layer having the phosphor concentration that corresponds to the dominant wavelength of the optical semiconductor element is selected. Accordingly, in this method, a method for producing a phosphor layer-covered optical semiconductor element is capable of being simplified by the easy adjusting step of adjusting the thickness of the phosphor layer.

As a result, a phosphor layer having a thickness that corresponds to a color tone to be aimed at is formed with an excellent yield and a phosphor layer-covered optical semiconductor element having excellent luminous efficiency is capable of being produced.

In the method for producing a phosphor layer-covered optical semiconductor element of the present invention, it is preferable that the adjusting step includes a pressing step of pressing at least one of the phosphor layer and the optical semiconductor element that are opposed to each other toward a direction in which the phosphor layer and the optical semiconductor element are close to each other.

In this method, the adjusting step includes the pressing step of pressing at least one of the phosphor layer and the optical semiconductor element that are opposed to each other toward the direction in which the phosphor layer and the optical semiconductor element are adjacent to each other, so that the basis weight of the phosphor in the phosphor layer is capable of being further more easily adjusted.

In the method for producing a phosphor layer-covered optical semiconductor element of the present invention, it is preferable that the phosphor layer is formed from a thermosetting resin and in the pressing step, the phosphor layer formed from the thermosetting resin is heated to be thermally cured.

In this method, by the pressing step, the phosphor layer is thermally cured, so that the thickness of the phosphor layer is adjusted to the thickness that corresponds to the color tone to be aimed at and at the same time, the optical semiconductor element is capable of being encapsulated by the phosphor layer.

In the method for producing a phosphor layer-covered optical semiconductor element of the present invention, it is preferable that the method for producing a phosphor layer-covered optical semiconductor element further includes a calibration curve preparation step including a first measurement step of measuring a thickness of a first reference phosphor layer at the time of opposing the first reference phosphor layer that is the same as the phosphor layer to the optical semiconductor element and a color tone of light emitted from the optical semiconductor element and exited via the first reference phosphor layer and a second measurement step of measuring a thickness of a second reference phosphor layer at the time of opposing the second reference phosphor layer that is the same as the phosphor layer to the optical semiconductor element so that the thickness thereof is different from that of the first reference phosphor layer and a color tone of light emitted from the optical semiconductor element and exited via the second reference phosphor layer and a calibration curve production step of producing a calibration curve based on the thickness and the color tone of the light obtained from the calibration curve preparation step, wherein in the adjusting step, the thickness of the phosphor layer that corresponds to the color tone to be aimed at is obtained based on the calibration curve and subsequently, the thickness of the phosphor layer is adjusted so as to have the thickness.

This method includes the calibration curve preparation step and the calibration curve production step and furthermore, in the adjusting step, the thickness of the phosphor layer that corresponds to the color tone to be aimed at is obtained based on the calibration curve produced in the calibration curve production step and subsequently, the thickness of the phosphor layer is adjusted to a thickness to be required. Thus, the thickness of the phosphor layer that corresponds to the color tone to be aimed at is surely obtained and the thickness of the phosphor layer is adjusted so as to be a thickness to be required, so that the phosphor layer-covered optical semiconductor element that is capable of emitting light having a color tone to be aimed at is capable of being surely and easily produced.

In the method for producing a phosphor layer-covered optical semiconductor element of the present invention, it is preferable that the calibration curve preparation step further includes a third measurement step of measuring a thickness of a third reference phosphor layer at the time of opposing the third reference phosphor layer that is the same as the phosphor layer to the optical semiconductor element so that the thickness thereof is different from that of the first reference phosphor layer and the second reference phosphor layer and a color tone of light emitted from the optical semiconductor element and exited via the third reference phosphor layer.

In this method, the calibration curve preparation step further includes the third measurement step, so that the thickness of the phosphor layer that corresponds to the color tone to be aimed at is capable of being accurately obtained based on the accurate calibration curve. Thus, the phosphor layer-covered optical semiconductor element that is capable of emitting the light having a color tone to be aimed at is capable of being further accurately produced.

A phosphor layer-covered optical semiconductor element of the present invention is obtained by the above-described method for producing a phosphor layer-covered optical semiconductor element.

The phosphor layer-covered optical semiconductor element includes the phosphor layer having a thickness that corresponds to the color tone to be aimed at, so that it has excellent luminous efficiency.

A method for producing an optical semiconductor device of the present invention includes the steps of preparing the above-described phosphor layer-covered optical semiconductor element and mounting an optical semiconductor element of the phosphor layer-covered optical semiconductor element on a board or mounting the optical semiconductor element on the board in advance.

In this method, the optical semiconductor device having excellent luminous efficiency is capable of being produced with an excellent yield.

An optical semiconductor device of the present invention is obtained by the above-described method for producing an optical semiconductor device.

The optical semiconductor device has excellent luminous efficiency.

BRIEF DESCRIPTION OF THE DRAWINGS

FIG. 1 (a) illustrating a step of mounting an LED on a board in advance (an LED mounting step), FIG. 1 (b) illustrating a step of temporarily attaching a phosphor layer to the LED, and FIG. 1 (c) illustrating a step of adjusting the thickness of the phosphor layer (an adjusting step).

FIG. 4 (a) illustrating a step of disposing an LED on a support sheet (a preparation step), FIG. 4 (b) illustrating a step of temporarily attaching a phosphor layer to the LED, FIG. 4 (c) illustrating a step of adjusting the thickness of the phosphor layer (an adjusting step), and FIG. 4 (d) illustrating a step of mounting a phosphor layer-covered LED on a board.

FIG. 5 (a) illustrating a step of mounting an LED on a board in advance (an LED mounting step), FIG. 5 (b) illustrating a step of temporarily attaching a phosphor layer including a first phosphor layer and a second phosphor layer to the LED, and FIG. 5 (c) illustrating a step of adjusting the thickness of the phosphor layer (an adjusting step).

FIG. 6 (a) illustrating a step of mounting an LED on a board in advance (an LED mounting step), FIG. 6 (b) illustrating a step of temporarily attaching a phosphor layer including a first phosphor layer in a C-stage state and a second phosphor layer in a B-stage state to the LED, and FIG. 6 (c) illustrating a step of adjusting the thickness of the phosphor layer (an adjusting step).

FIG. 7 (a) illustrating a step of encapsulating an LED by an encapsulating layer, FIG. 7 (b) illustrating a step of temporarily attaching a phosphor layer to the encapsulating layer, and FIG. 7 (c) illustrating a step of adjusting the thickness of the phosphor layer (an adjusting step).

DETAILED DESCRIPTION OF THE INVENTION

First Embodiment

Figure 1:
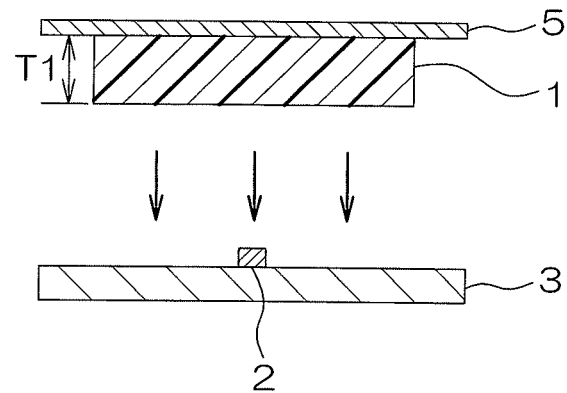
FIG. 1 shows process drawings for illustrating a first embodiment of a method for producing a phosphor layer-covered optical semiconductor element and an optical semiconductor device of the present invention.
Figure 1:
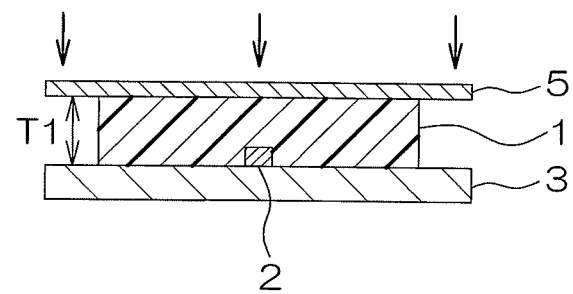
Figure 1:
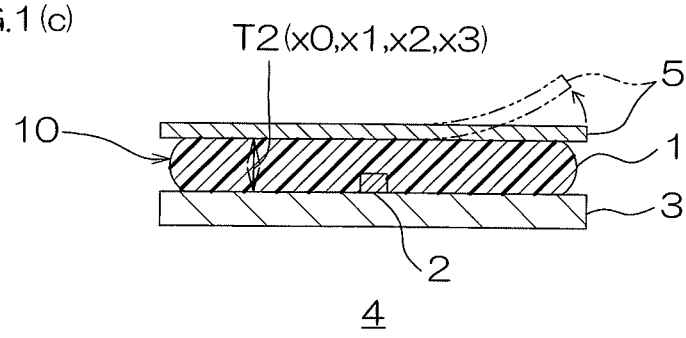

In FIG. 1, the up-down direction of the paper surface may be referred to as a first direction (a top-back direction); the right-left direction of the paper surface may be referred to as a second direction (a plane direction); and the depth direction of the paper surface may be referred to as a third direction (the plane direction). Directions in FIG. 4 and the subsequent figures are in conformity with the directions in FIG. 1.

As shown in FIG. 1, a method for producing an LED device 4 as an optical semiconductor device includes an LED mounting step (ref: FIG. 1 (a)) of mounting an LED 2 as an optical semiconductor element on a board 3 in advance, a disposing step (ref: FIG. 1 (b)) of opposing a phosphor layer 1 to the LED 2, and an adjusting step (ref: FIG. 1 (c)) of adjusting the thickness of the phosphor layer 1. The method for producing the LED device 4 includes a calibration curve preparation step and a calibration curve production step.

The board 3 is, for example, formed of an insulating board such as a silicon board, a ceramic board, a polyimide resin board, or a laminated board in which an insulating layer is laminated on a metal board.

On the surface of the board 3, a conductive pattern (not shown) including a board-side terminal (not shown) to be electrically connected to an LED-side terminal (not shown) in the LED 2 to be described next and a wire to be continuous thereto is formed. The conductive pattern is, for example, formed of a conductor such as gold, copper, silver, or nickel.

The LED 2 is an optical semiconductor element that converts electrical energy to light energy. The LED 2 is, for example, formed into a generally rectangular shape in sectional view and a generally rectangular shape in plane view with the thickness (the maximum length in the top-back direction, that is, the length in a direction perpendicular to the plane direction of the board 3) shorter than the length in the plane direction (the maximum length in a direction perpendicular to the top-back direction). An example of the LED 2 includes a blue LED (a light emitting diode element) that emits blue light.

The LED 2 is mounted on the board 3 by, for example, a wire-bonding connection or a flip-chip mounting.

The back surface of the LED 2 that is subjected to the flip-chip mounting is formed of the LED-side terminal that is not shown. The LED-side terminal is electrically subjected to a direct connection to the board-side terminal (not shown) that is provided on the surface of the board 3, so that the LED 2 is mounted on the board 3.

On the other hand, the surface of the LED 2 that is subjected to the wire-bonding connection is formed of the LED-side terminal that is not shown. The LED-side terminal is electrically connected to the board-side terminal (not shown) that is disposed at spaced intervals to a disposed position of the LED 2 on the surface of the board 3 in the plane direction via a wire (not shown), so that the LED 2 is mounted on the board 3.

The phosphor layer 1 is formed from a phosphor composition containing a phosphor.

The phosphor has a wavelength conversion function and examples thereof include a yellow phosphor that is capable of converting blue light into yellow light and a red phosphor that is capable of converting blue light into red light.

Examples of the yellow phosphor include a silicate phosphor such as $(Ba, Sr, Ca)_2SiO_4:Eu$ and $(Sr,Ba)_2SiO_4:Eu$ (barium orthosilicate (BOS)); a garnet type phosphor having a garnet type crystal structure such as $Y_3Al_5O_{12}:Ce$ (YAG (yttrium aluminum garnet):Ce) and $Tb_3Al_3O_{12}:Ce$ (TAG (terbium aluminum garnet):Ce); and an oxynitride phosphor such as Ca—α—SiAlON.

An example of the red phosphor includes a nitride phosphor such as $CaAlSiN_3:Eu$ and $CaSiN_2:Eu$.

The peak wavelength of the phosphor is, for example, 400 nm or more, or preferably 500 nm or more, and is, for example, 700 nm or less, or preferably 600 nm or less. The peak wavelength of the phosphor is measured with an emission spectrum at the time of being excited with blue light.

The excitation wavelength of the blue light that excites the phosphor is, for example, 300 nm or more, or preferably 400 nm or more, and is, for example, 600 nm or less, or preferably 500 nm or less. The optimal excitation wavelength of each of the phosphors is searched with an absorptivity or quantum efficiency of the phosphor at each of the wavelengths.

Examples of a shape of the phosphor include a sphere shape, a plate shape, and a needle shape. Preferably, in view of fluidity, a sphere shape is used.

The average value of the maximum length (in the case of a sphere shape, the average particle size) of the phosphor is, for example, 0.1 μm or more, or preferably 1 μm or more, and is, for example, 200 μm or less, or preferably 100 μm or less. The average particle size of the phosphor in a sphere shape is calculated as d50.

The mixing ratio of the phosphor with respect to a phosphor composition (to be specific, a phosphor resin composition to be described later) is, for example, 0.1 mass % or more, or preferably 0.5 mass % or more, and is, for example, 80 mass % or less, or preferably 50 mass % or less.

Preferably, the phosphor layer 1 is formed from a phosphor resin composition containing a phosphor and a curable resin.

Examples of the curable resin include a thermosetting resin that is cured by heating and an active energy ray curable resin that is cured by application of an active energy ray (for example, an ultraviolet ray and an electron beam). Preferably, a thermosetting resin is used.

To be specific, an example of the curable resin includes a thermosetting resin such as a silicone resin, an epoxy resin, a polyimide resin, a phenol resin, a urea resin, a melamine resin, and an unsaturated polyester resin. Preferably, a silicone resin is used.

An example of the silicone resin includes a silicone resin such as a two-step curable type silicone resin and a one-step curable type silicone resin. Preferably, a two-step curable type silicone resin is used.

The two-step curable type silicone resin is a thermosetting silicone resin that has a two-step reaction mechanism and in which a silicone resin is brought into a B-stage state (a semi-cured state) in the first-step reaction and is brought into a C-stage state (a completely cured state) in the second-step reaction. On the other hand, the one-step curable type silicone resin is a thermosetting silicone resin that has a one-step reaction mechanism and in which a silicone resin is completely cured in the first-step reaction.

The B-stage state is a state between an A-stage state in which a curable silicone resin is in a liquid state and a C-stage state in which the curable silicone resin is completely cured. Also, the B-stage state is a state in which the curing and the gelation of the curable silicone resin are slightly progressed and the elastic modulus thereof is smaller than the elastic modulus thereof in a C-stage state.

An example of the two-step curable type silicone resin includes a condensation reaction and addition reaction curable type silicone resin having two reaction systems of a condensation reaction and an addition reaction.

Examples of the condensation reaction and addition reaction curable type silicone resin include a first condensation reaction and addition reaction curable type silicone resin that contains a polysiloxane containing silanol groups at both ends, an alkenyl group-containing trialkoxysilane, an organohydrogenpolysiloxane, a condensation catalyst, and a hydrosilylation catalyst; a second condensation reaction and addition reaction curable type silicone resin that contains a polysiloxane containing silanol groups at both ends (ref: formula (1) to be described later), an ethylenically unsaturated hydrocarbon group-containing silicon compound (ref: formula (2) to be described later), an epoxy group-containing silicon compound (ref: formula (3) to be described later), an organohydrogenpolysiloxane, a condensation catalyst, and an addition catalyst (a hydrosilylation catalyst); a third condensation reaction and addition reaction curable type silicone resin that contains a silicone oil containing silanol groups at both ends, an alkenyl group-containing dialkoxyalkylsilane, an organohydrogenpolysiloxane, a condensation catalyst, and a hydrosilylation catalyst; a fourth condensation reaction and addition reaction curable type silicone resin that contains an organopolysiloxane having, in one molecule, at least two alkenylsilyl groups, an organopolysiloxane having, in one molecule, at least two hydrosilyl groups, a hydrosilylation catalyst, and a curing retarder; a fifth condensation reaction and addition reaction curable type silicone resin that contains a first organopolysiloxane having, in one molecule, both at least two ethylenically unsaturated hydrocarbon groups and at least two hydrosilyl groups, a second organopolysiloxane having, in one molecule, at least two hydrosilyl groups without containing an ethylenically unsaturated hydrocarbon group, a hydrosilylation catalyst, and a hydrosilylation retarder; a sixth condensation reaction and addition reaction curable type silicone resin that contains a first organopolysiloxane having, in one molecule, both at least two ethylenically unsaturated hydrocarbon groups and at least two silanol groups, a second organopolysiloxane having, in one molecule, at least two hydrosilyl groups without containing an ethylenically unsaturated hydrocarbon group, a hydrosilylation retarder, and a hydrosilylation catalyst; a seventh condensation reaction and addition reaction curable type silicone resin that contains a silicon compound, and a boron compound or an aluminum compound; and an eighth condensation reaction and addition reaction curable type silicone resin that contains a polyaluminosiloxane and a silane coupling agent.

These condensation reaction and addition reaction curable type silicone resins can be used alone or in combination of two or more.

As the condensation reaction and addition reaction curable type silicone resin, preferably, a second condensation reaction and addition reaction curable type silicone resin is used. To be specific, the second condensation reaction and addition reaction curable type silicone resin is described in detail in Japanese Unexamined Patent Publication No. 2010-265436 or the like and contains, for example, a polydimethylsiloxane containing silanol groups at both ends, a vinyltrimethoxysilane, a (3-glycidoxypropyl)trimethoxysilane, a dimethylpolysiloxane-co-methylhydrogenpolysiloxane, a tetramethylammonium hydroxide, and a platinum carbonyl complex. To be specific, in order to prepare the second condensation reaction and addition reaction curable type silicone resin, for example, first, an ethylenically unsaturated hydrocarbon group-containing silicon compound and an epoxy group-containing silicon compound, which are a condensation material, and a condensation catalyst are simultaneously added; next, an organohydrogenpolysiloxane, which is an addition material, is added thereto; and thereafter, a hydroxilylation catalyst, which is an addition catalyst, is added thereto.

The mixing ratio of the curable resin with respect to the phosphor resin composition is, for example, 30 mass % or more, or preferably 50 mass % or more, and is, for example, 99 mass % or less, or preferably 95 mass % or less.

Furthermore, the phosphor resin composition can also contain a filler.

Examples of the filler include organic microparticles such as silicone particles and inorganic microparticles such as silica, talc, alumina, aluminum nitride, and silicon nitride. The average value of the maximum length (in the case of a sphere shape, the average particle size) of the filler is, for example, 0.1 μm or more, or preferably 1 μm or more, and is, for example, 200 μm or less, or preferably 100 μm or less. The mixing ratio of the filler with respect to the phosphor resin composition is, for example, 0.1 mass % or more, or preferably 0.5 mass % or more, and is, for example, 70 mass % or less, or preferably 50 mass % or less.

Next, each of the steps in the method for producing the LED device 4 is described in detail.

[LED Mounting Step]

In the LED mounting step, the LED 2 is mounted on the board 3 in advance. To be specific, the LED-side terminal in the LED 2 and the board-side terminal in the board 3 are electrically connected to each other by a flip-chip mounting or a wire-bonding connection.

[Disposing Step]

When the phosphor layer 1 is formed from a phosphor resin composition containing a curable resin, the phosphor layer 1 is prepared in a state before complete curing. To be specific, when the curable resin is a two-step curable type silicone resin, the phosphor layer 1 is prepared in a B-stage state. The phosphor layer 1 is prepared on the surface of a release layer 5.

The phosphor layer 1 before complete curing has a compressive elastic modulus at 25° C. of, for example, 0.005 MPa or more, or preferably 0.01 MPa or more, and of, for example, 1 MPa or less, or preferably 0.1 MPa or less.

Examples of the release layer 5 include a polymer film such as a polyethylene film and a polyester film (PET or the like), a ceramic sheet, and a metal foil. Preferably, a polymer film is used. The surface of the release layer 5 can be also subjected to release treatment such as fluorine treatment.

When the phosphor resin composition contains a two-step curable type silicone resin, a phosphor and, if necessary, a filler are blended into the above-described material of the curable resin and the obtained composition is applied to the surface of the release layer 5 to be then heated. The heating temperature is, for example, 40 to 150° C., or preferably 80 to 140° C. and the heating duration is, for example, 1 minute to 24 hours, or preferably, 1 minute to 1 hour.

In this way, the phosphor layer 1 is prepared in a B-stage state (as a state before completely curing) on the surface of the release layer 5.

The thickness of the phosphor layer 1 before complete curing is, for example, set to be thicker than that of the phosphor layer 1 after thickness adjustment to be described later. To be specific, a thickness T1 of the phosphor layer 1 is, for example, 200 μm or more, preferably 300 μm or more, or more preferably 500 μm or more, and is, for example, 1500 μm or less.

[Disposing Step]

In the disposing step, as shown in FIGS. 1 (b) and 1 (c), the prepared phosphor layer 1 is opposed to the LED 2.

To be specific, the phosphor layer 1 that is laminated on the release layer 5 is disposed in opposed relation to the LED 2 that is mounted on the board 3 in the up-down direction.

To be more specific, before the next adjusting step, the phosphor layer 1 is temporarily attached to the LED 2. In order to temporarily attach the phosphor layer 1 to the LED 2, for example, the phosphor layer 1 is compressively bonded to the LED 2 at a normal temperature with a press machine provided with an upper press plate and a lower press plate under a vacuum atmosphere for, for example, 5 seconds or more, or preferably 10 seconds or more, and for, for example, 200 seconds or less, or preferably 100 seconds or less. In the compressive bonding, a spacer having a thickness (to be specific, a set thickness x0) that is thicker than that of a spacer (not shown) used in the adjusting step to be described later is used.

In the disposing step, preferably, the thickness T1 of the phosphor layer 1 becomes slightly thinner by the compressive bonding.

The LED 2 is embedded in the phosphor layer 1 by the compressive bonding in the disposing step. That is, the phosphor layer 1 embeds the LED 2.

[Adjusting Step]

In the adjusting step, as shown in FIG. 1 (c), the phosphor layer 1 is further compressively bonded to the LED 2 and the board 3.

The further compressive bonding of the phosphor layer 1 to the LED 2 and the board 3 is performed by controlling a pushed-in amount of the phosphor sheet 5 in the thickness direction (the up-down direction).

The pushed-in amount is controlled in the following manner. A spacer having a predetermined thickness, which is not shown, is disposed on the upper surface of or around the board 3 in the form of a generally frame shape in plane view so as to surround the LED 2 to be then pressed. In the pressing, in the upper plate and the lower plate (not shown) of the press machine, the upper plate is close to the lower plate so as to sandwich the spacer (not shown), the board 3, the LED 2, and the phosphor layer 1 between the upper plate and the lower plate and the phosphor layer 1 is pushed in (pressed: the pressing step) with respect to the LED 2 and the board 3. The thickness of the spacer is, for example, set so that the thickness of the phosphor layer 1 after encapsulation serves as a thickness T2 of the phosphor layer 1 after the thickness adjustment. In the pressing, auxiliary plates made of a metal such as stainless steel are also capable of being provided as required between the upper plate of the press machine and the phosphor layer 1 and between the lower plate of the press machine and the board 3. The two auxiliary plates are, for example, disposed in parallel to each other.

Alternatively, an amount of displacement in the up-down (the thickness) direction of the press plate of the press machine is adjusted and the pushed-in amount is also capable of being controlled.

When the phosphor resin composition contains a thermosetting resin, for example, heating (baking) is performed with an oven, for example, pressing is performed with heating (hot pressing), or preferably heating is performed with an oven. In the heating with an oven, for example, the above-described pressing is retained and the phosphor layer 1 is heated.

To be specific, the phosphor layer 1 is heated at, for example, 80° C. or more, or preferably 100° C. or more, and at, for example, 200° C. or less, or preferably 180° C. or less. The phosphor layer 1 before complete curing is completely cured by the above-described heating. To be specific, when the phosphor layer 1 before complete curing is in a B-stage state, the phosphor layer 1 is brought into a C-stage state by the above-described heating.

The compressive bonding is performed under a reduced pressure atmosphere or under a normal pressure atmosphere. Preferably, the compressive bonding is performed under a reduced pressure atmosphere.

The thickness T2 of the phosphor layer 1 is thinner than the thickness T1 of the phosphor layer 1 before complete curing by the further compressive bonding of the phosphor layer 1 with respect to the LED 2 and the board 3. That is, by the above-described compressive bonding, the phosphor layer 1 is squashed to be pushed out outwardly in the plane direction. Thus, the number of parts by mass of the phosphor per unit area in plane view is adjusted. To be specific, the number of parts by mass of the phosphor per unit area is reduced to a predetermined amount.

The thickness T2 of the phosphor layer 1 after the thickness adjustment is a length between the back-most surface of the LED 2 (that is, the top-most surface of the board 3) and the top-most surface of the phosphor layer 1 (to be specific, the surface that is in contact with the release layer 5 and also the surface of the phosphor layer 1 that is positioned at a height farthest from the top-most surface of the board 3). To be specific, the thickness T2 of the phosphor layer 1 after the thickness adjustment is calculated as a thickness x0 of the phosphor layer 1 that corresponds to a color tone y0 to be aimed at based on the calibration curve to be described next.

Thereafter, the release layer 5 is peeled from the phosphor layer 1.

[Calibration Curve Preparation Step]

The calibration curve preparation step includes a first measurement step and a second measurement step.

<First Measurement Step and Second Measurement Step>

The first measurement step and the second measurement step are the steps for obtaining a thickness and a color tone of light that serve as a reference in production of the calibration curve.

In the first measurement step, a first reference phosphor layer 1A is opposed to the LED 2 and a thickness x1 (ref: FIG. 1 (c)) of the first reference phosphor layer 1A at the time of being compressively bonded to the LED 2 and the board 3 and a color tone y1 of light emitted from the LED 2 and exited via the first reference phosphor layer 1A are measured.

As the first reference phosphor layer 1A, the LED 2, and the board 3, the same phosphor layer 1, LED 2, and board 3 as those used in the production of the LED device 4 are used, respectively. The conditions of the compressive bonding of the first reference phosphor layer 1A are the same as those of the compressive bonding of the phosphor layer 1 described above, except for the thickness of the spacer. That is, the thickness x1 of the first reference phosphor layer 1A in the LED device 4 obtained by sequentially performing the above-described LED mounting step, disposing step, and adjusting step and the color tone y1 of light emitted from the LED 2 and exited via the first reference phosphor layer 1A in the obtained LED device 4 are measured.

In the second measurement step, a second reference phosphor layer 1B is opposed to the LED 2 and a thickness x2 of the second reference phosphor layer 1B at the time of being compressively bonded to the LED 2 and the board 3 and a color tone y2 of light emitted from the LED 2 and exited via the second reference phosphor layer 1B are measured.

The thickness x2 of the second reference phosphor layer 1B is set so as to be different from the thickness of the first reference phosphor layer 1A.

The thickness x2 of the second reference phosphor layer 1B in the LED device 4 obtained by sequentially performing the above-described LED mounting step, disposing step, and adjusting step and the color tone y2 of light emitted from the LED 2 and exited via the second reference phosphor layer 1B in the obtained LED device 4 are measured.

The thickness x1 of the first reference phosphor layer 1A and the thickness x2 of the second reference phosphor layer 1B are defined as the same length as the thickness T2 of the phosphor layer 1.

The color tone y1 and the color tone y2 are measured as a chromaticity (CIE-y) of the total luminous flux by an integrating sphere method using, for example, an instantaneous multiple photometric system (MCPD-9800, manufactured by OTSUKA ELECTRONICS CO., LTD.) or the like.

[Calibration Curve Production Step]

In the calibration curve production step, the calibration curve is produced based on the thickness x1 and x2 and the color tone y1 and y2 obtained in the calibration curve preparation step.

Figure 2:
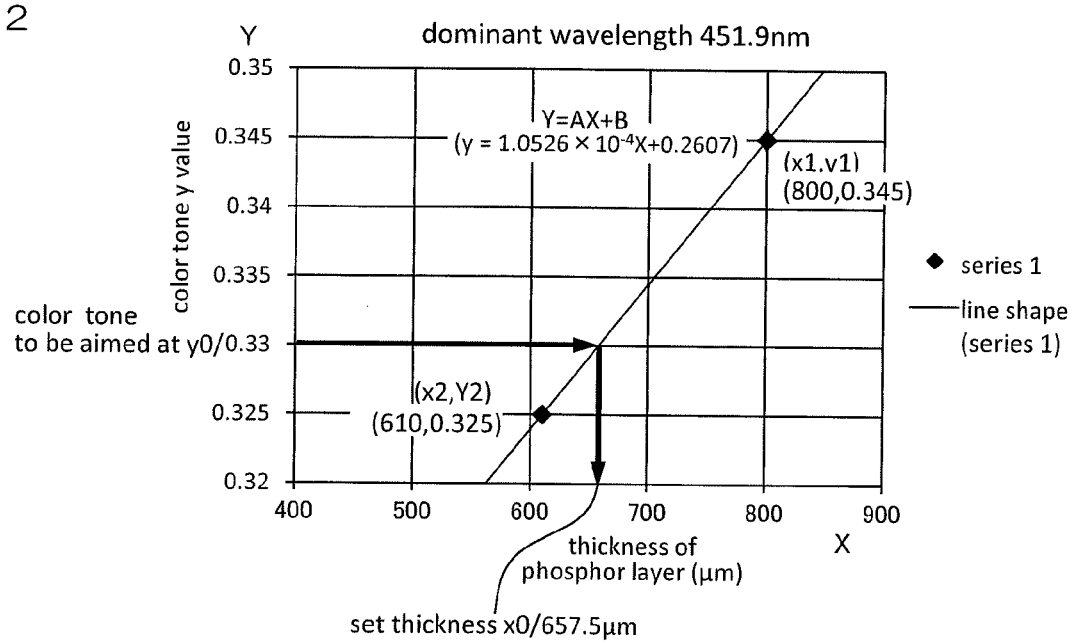
FIG. 2 shows a graph illustrating a relationship between the thickness of a phosphor layer and a color tone of light that is emitted from an LED having a dominant wavelength of 451.9 nm and exited via the phosphor layer in Calibration Curve Production Example 1.

To be specific, as referred in FIG. 2, in an X-Y coordinate in which a thickness X is defined as the horizontal axis and a color tone Y is defined as the vertical axis, the thickness x1 and x2 and the color tone y1 and y2 are plotted and a straight line passing through them, that is, a straight line of $Y=AX+B$ is obtained as a calibration curve.

X: thickness (μm)
Y: color tone

Then, a thickness x0 of the phosphor layer 1 that corresponds to a color tone y0 to be aimed at is obtained based on the above-described calibration curve: $Y=AX+B$.

To be specific, the color tone y0 to be aimed at is already known, so that the color tone y0 is substituted into the calibration curve: $Y=AX+B$ (A and B are also already known) and the thickness x0 of the phosphor layer 1 that corresponds to the color tone y0 to be aimed at is obtained. That is, a set thickness x0 of the phosphor layer 1 is obtained.

Then, the thickness of the phosphor layer 1 is adjusted by a method in the above-described [Adjusting Step] so as to have the set thickness x0.

Thereafter, the release layer 5 is peeled from the phosphor layer 1.

In this way, as shown in FIG. 1 (b), the LED device 4 is obtained as a package including the board 3, the LED 2, and the phosphor layer 1 in which the thickness T1 is adjusted to the thickness T2. As a phosphor layer-covered optical semiconductor element, a phosphor layer-covered LED 10 including the LED 2 and the phosphor layer 1 that covers the LED 2 is fabricated on the board 3, while the LED device 4 is obtained.

The above-described method includes the adjusting step of adjusting the color tone y0 of light emitted from the LED 2 and exited via the phosphor layer 1 by adjusting the thickness T1 of the phosphor layer 1 to the thickness T2. Thus, by an easy method of adjusting the thickness T1 of the phosphor layer 1 to the thickness T2, the number of parts by mass of the phosphor per unit area in the phosphor layer 1, to be specific, a basis weight of the phosphor in the phosphor layer 1 is capable of being adjusted so as to correspond to the color tone y0 to be aimed at. Therefore, as in Japanese Unexamined Patent Publication No. 2007-123915, it is not required that a plurality of the phosphor layers 1 each having a different phosphor concentration are prepared in advance and of those, the phosphor layer 1 having the phosphor concentration that corresponds to the dominant wavelength of the LED 2 is selected. Accordingly, in the method in the first embodiment, a method for producing the phosphor layer-covered LED 10 and the LED device 4 is capable of being simplified by the easy adjusting step of adjusting the thickness T1 of the phosphor layer 1 to the thickness T2.

As a result, the phosphor layer 1 in which the thickness T1 is adjusted to the thickness T2 that is the set thickness x0 that corresponds to the color tone y0 to be aimed at is formed with an excellent yield and a phosphor layer-covered LED 10 and the LED device 4 having excellent luminous efficiency are capable of being produced.

In this method, the adjusting step includes the pressing step of pressing the phosphor layer 1 that is opposed to the LED 2 toward the LED 2, so that the basis weight of the phosphor in the phosphor layer 1 is capable of being further more easily adjusted.

In this method, when the phosphor resin composition contains a thermosetting resin, by the pressing step, the phosphor layer 1 is thermally cured by the hot pressing, so that the thickness T1 of the phosphor layer 1 is adjusted to the thickness T2 that is the thickness x0 that corresponds to the color tone y0 to be aimed at and at the same time, the LED 2 is capable of being encapsulated by the phosphor layer 1.

This method includes the calibration curve preparation step and the calibration curve production step and furthermore, in the adjusting step, the set thickness x0 of the phosphor layer 1 that corresponds to the color tone y0 to be aimed at is obtained based on the calibration curve: $Y=AX+B$ produced in the calibration curve production step and subsequently, the thickness T1 of the phosphor layer 1 is adjusted to the set thickness x0 to be required. Thus, the set thickness x0 of the phosphor layer 1 that corresponds to the color tone y0 to be aimed at is surely obtained and the thickness T1 of the phosphor layer 1 is adjusted to the thickness T2 so as to be the set thickness x0 to be required, so that the phosphor layer-covered LED 10 and the LED device 4 that are capable of emitting light having the color tone y0 to be aimed at are capable of being surely and easily produced.

The phosphor layer-covered LED 10 and the LED device 4 include the phosphor layer 1 having the thickness T2 that is the set thickness x0 that corresponds to the color tone y0 to be aimed at, so that the phosphor layer-covered LED 10 and the LED device 4 have excellent luminous efficiency.

In this method, the LED device 4 having excellent luminous efficiency is capable of being produced with an excellent yield.

Modified Example

In the first embodiment, one piece of the LED 2 is mounted on the board 3 and one piece of the LED 2 is encapsulated by one piece of the phosphor layer 1. Alternatively, for example, though not shown, a plurality of the LEDs 2 are mounted on the board 3 and a plurality of the LEDs 2 are also capable of being encapsulated by one piece of the phosphor layer 1.

In such a case, in the obtained LED device 4, the phosphor layer 1 and the board 3 are singulated into individual pieces corresponding to the respective LEDs 2 by dicing and then, the obtained piece is capable of being appropriately selected.

Figure 3:
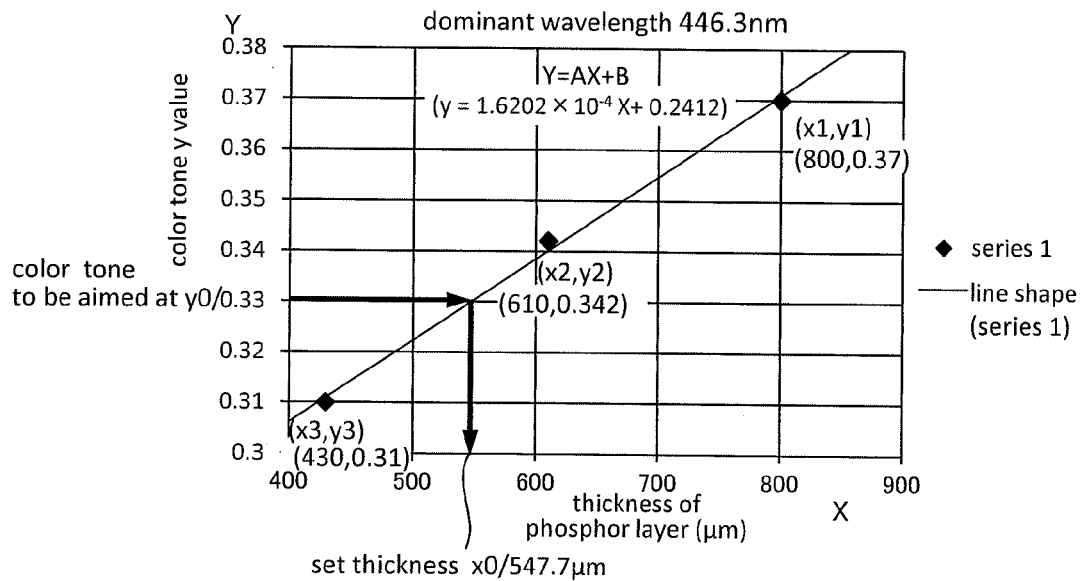
FIG. 3 shows a graph illustrating a relationship between the thickness of a phosphor layer and a color tone of light that is emitted from an LED having a dominant wavelength of 446.3 nm and exited via the phosphor layer in Calibration Curve Production Example 2.
Figure 4A:
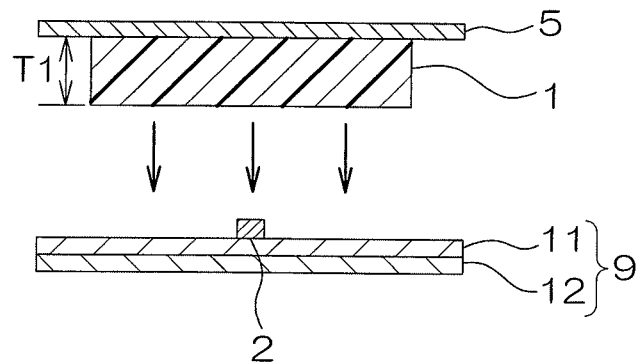
FIG. 4 shows process drawings for illustrating a second embodiment of a method for producing a phosphor layer-covered optical semiconductor element and an optical semiconductor device of the present invention.
Figure 4B:
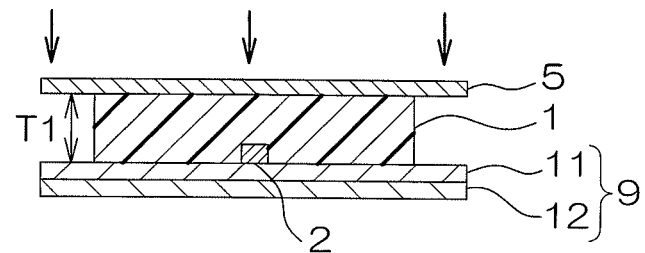
Figure 4C:
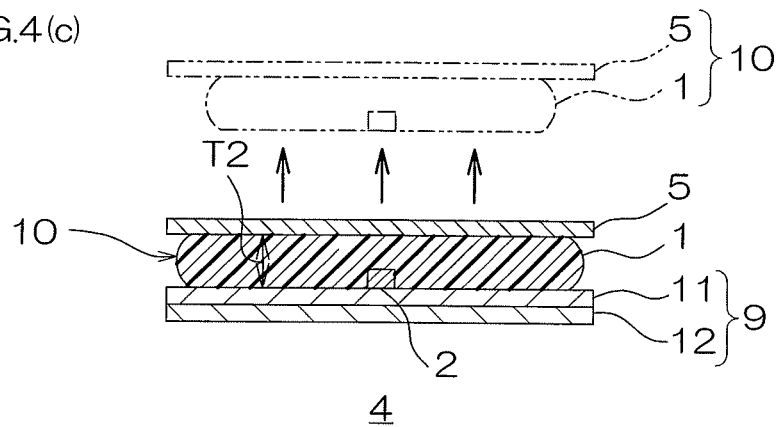
Figure 4D:
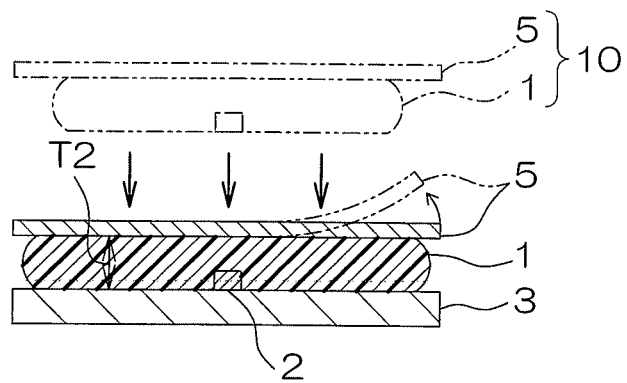

In the first embodiment, in the first measurement step and the second measurement step in the calibration curve preparation step, the thickness x1 of the first reference phosphor layer 1A and the thickness x2 of the second reference phosphor layer 1B, which are two different types having a different set thickness, and the respective color tone y1 and color tone y2 are measured from the phosphor layer 1 having the same thickness. In the calibration curve production step, the calibration curve is produced based on those values. However, the set thickness of the reference phosphor layers may be different plurality of types. For example, as shown in FIG. 3, the thickness x1 of the first reference phosphor layer 1A, the thickness x2 of the second reference phosphor layer 1B, and a thickness x3 of a third reference phosphor layer 1C, which are three different types having a different set thickness, and the respective color tone y1, color tone y2, and color tone y3, are also capable of being measured from the phosphor layer 1 having the same thickness.

In this method, the calibration curve preparation step includes the first measurement step, the second measurement step, and the third measurement step.

[Third Measurement Step]

In the third measurement step, the third reference phosphor layer 1C is opposed to the LED 2 and the thickness x3 of the third reference phosphor layer 1C at the time of being compressively bonded to the LED 2 and the board 3 and the color tone y3 of light emitted from the LED 2 and exited via the third reference phosphor layer 1C are measured.

The thickness x3 of the third reference phosphor layer 1C is set so as to be different from the thickness of the first reference phosphor layer 1A and that of the second reference phosphor layer 1B. The color tone y3 is defined and measured in the same method as that in the above-described color tone y1 and color tone y2.

[Calibration Curve Production Step]

In the calibration curve production step, the calibration curve is produced based on the thickness x1, x2, and x3 and the color tone y1, y2, and y3 obtained in the calibration curve preparation step.

To be specific, as shown in FIG. 3, in the X-Y coordinate, the thickness x1, x2, and x3 and the color tone y1, y2, and y3 are plotted and a straight line approximating them, that is, an approximate straight line (a first approximate straight line, a regression line based on a linear regression calculation) of Y=AX+B is obtained as a calibration curve.

Then, the thickness T2 of the phosphor layer 1 is adjusted by the same method as that in the above-described [Adjusting Step] so as to have the set thickness x0.

The thickness x0 of the phosphor layer 1 that corresponds to the color tone y0 to be aimed at is obtained based on the approximate straight line.

According to this method, the calibration curve preparation step further includes the third measurement step, so that the thickness x0 of the phosphor layer 1 that corresponds to the color tone y0 to be aimed at is capable of being accurately obtained based on the accurate calibration curve, that is, the approximate linear line: Y=AX+B. Thus, the phosphor layer-covered LED 10 and the LED device 4 that are capable of emitting the light having the color tone y0 to be aimed at are capable of being further accurately produced.

In the first embodiment, in the further pressing in the adjusting step, the phosphor layer 1 is pressed toward the LED 2 and the board 3. Alternatively, for example, oppositely, that is, the LED 2 and the board 3 are also capable of being pressed toward the phosphor layer 1. Furthermore, both of the phosphor layer 1 and the LED 2 are also capable of being close to each other so as to be pressed to each other.

In addition, in the adjusting step in the first embodiment, the thickness of the phosphor layer 1 is adjusted by pressing the phosphor layer 1 before complete curing. Alternatively, for example, first, the phosphor layer 1 is completely cured (is brought into a C-stage state) and then, the surface of the phosphor layer 1 after curing is polished (a polishing step), so that the thickness of the phosphor layer 1 is capable of being adjusted, that is, being set to a predetermined thickness.

In view of advantages of not requiring an added step such as a polishing step and not requiring a step of cleansing (removing) shavings, the thickness of the phosphor layer 1 is adjusted preferably by pressing the phosphor layer 1 before complete curing, or more preferably by pressing the phosphor layer 1 in a B-stage state.

Second Embodiment

In FIG. 4, the same reference numerals are provided for members and steps corresponding to each of those in the first embodiment, and their detailed description is omitted.

In the embodiment in FIG. 1, as shown in FIG. 1 (a), the LED 2 is mounted on the board 3 in advance and thereafter, as shown in FIGS. 1 (b) and 1 (c), the LED 2 is encapsulated by the phosphor layer 1. Alternatively, for example, as shown in FIG. 4, first, the LED 2 is encapsulated by the phosphor layer 1 and the phosphor layer-covered LED 10 is fabricated to be prepared (ref: FIGS. 4 (b) and 4 (c)) and thereafter, the LED 2 of the phosphor layer-covered LED 10 is also capable of being mounted on the board 3 (ref: FIG. 4 (d)).

The second embodiment includes a preparation step (ref: FIG. 4 (a)) of disposing the LED 2 on the surface of a support sheet 9 to be prepared, a disposing step (ref: FIG. 4 (b)), an adjusting step (ref: FIG. 4 (c)), a calibration curve preparation step, a calibration curve production step (ref: FIGS. 2 and 3), and a phosphor layer-covered LED mounting step (ref: FIG. 4 (d)).

[Preparation Step]

In the preparation step, the LED 2 is disposed on the support sheet 9.

As shown by the lower-side view in FIG. 4 (a), the support sheet 9 is formed into a sheet shape extending in the plane direction. The support sheet 9 is configured to be capable of supporting the LED 2 and includes, for example, a support board 12 and a pressure-sensitive adhesive layer 11 that is laminated on the surface of the support board 12.

The support board 12 is provided as the back surface of the support sheet 9. The support board 12 is formed into the same shape as the outer shape of the support sheet 9. The support board 12 is incapable of stretching at least in the plane direction and is formed of a hard material. To be specific, examples of the material include an oxide such as a silicon oxide (silica or the like) and alumina and a metal such as stainless steel and silicon. The thickness of the support board 12 is, for example, 0.1 mm or more, or preferably 0.3 mm or more, and is, for example, 5 mm or less, or preferably 2 mm or less.

The pressure-sensitive adhesive layer 11 is formed on the entire surface of the support board 12. An example of a pressure-sensitive adhesive material for forming the pressure-sensitive adhesive layer 11 includes a pressure-sensitive adhesive such as an acrylic pressure-sensitive adhesive and a silicone pressure-sensitive adhesive. A pressure-sensitive adhesive material can be widely selected from materials that are capable of being usually used as a pressure-sensitive adhesive material, in addition to materials in which the pressure-sensitive adhesive force is capable of being reduced by application of ultraviolet ray, a chemical solution, or heating. The thickness of the pressure-sensitive adhesive layer 11 is, for example, 0.01 mm or more, or preferably 0.2 mm or more, and is 1 mm or less, or preferably 0.5 mm or less.

In order to prepare the support sheet 9, for example, the support board 12 is attached to the pressure-sensitive adhesive layer 11.

The thickness of the support sheet 9 is, for example, 0.2 mm or more, or preferably 0.5 mm or more, and is 6 mm or less, or preferably 2.5 mm or less.

In the preparation step, to be specific, the LED 2 is attached to the pressure-sensitive adhesive layer 3.

[Disposing Step and Adjusting Step]

The disposing step and the adjusting step in the second embodiment are performed in the same manner as those in the first embodiment, except that the support sheet 9 is used instead of the board 3.

By the adjusting step, the phosphor layer-covered LED 10 including the phosphor layer 1 in which the thickness T1 is adjusted to the thickness T2 and the LED 2 that is encapsulated by the phosphor layer 1 is obtained.

Thereafter, when the phosphor layer-covered LEDs 10 are multi-chips including a plurality of the LEDs 2 that are flip-chip mounted on the board 3, the phosphor layer-covered LEDs 10 are appropriately individualized based on one piece of the LED 2 by dicing, so that chips (the phosphor layer-covered LEDs 10), each of which has one piece of the LED 2 that is encapsulated by the phosphor layer 1, are obtained. In the dicing, when the cutting is performed in a center between the LEDs 2 in a state where the LEDs 2 are fixed to the pressure-sensitive adhesive layer 11, encapsulated chips (the phosphor layer-covered LEDs 10 each having one piece of the LED 2) having a uniform size are obtained. The dicing is performed after the release layer 5 is first peeled off. Thereafter, each of the chips is picked up one by one and is mounted on the board 3 to be then allowed to emit light. The color tone thereof is checked and a calibration curve to be described later is produced.

[Calibration Curve Preparation Step and Calibration Curve Production Step]

The calibration curve preparation step and the calibration curve production step in the second embodiment are performed in the same manner as those in the first embodiment.

[Phosphor Layer-Covered LED Mounting Step]

In the phosphor layer-covered LED mounting step, the LED 2 in the phosphor layer-covered LED 10 is flip-chip mounted on the board 3. Thereafter, as shown by a phantom line in FIG. 4 (d), the release layer 5 is peeled from the phosphor layer 1.

In this way, the LED device 4 is obtained.

In the LED device 4, the same function and effect as that of the LED device 4 in the first embodiment can be achieved. Furthermore, after the phosphor layer-covered LED 10 is selected in accordance with emission wavelength and luminous efficiency, the selected phosphor layer-covered LED 10 is capable of being mounted on the board 3, so that the LED device 4 having further excellent luminous efficiency is capable of being obtained.

Third Embodiment

Figure 5A:
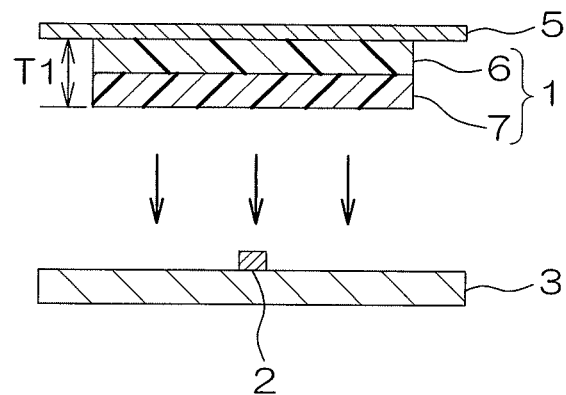
FIG. 5 shows process drawings for illustrating a third embodiment of a method for producing a phosphor layer-covered optical semiconductor element and an optical semiconductor device of the present invention.
Figure 5B:
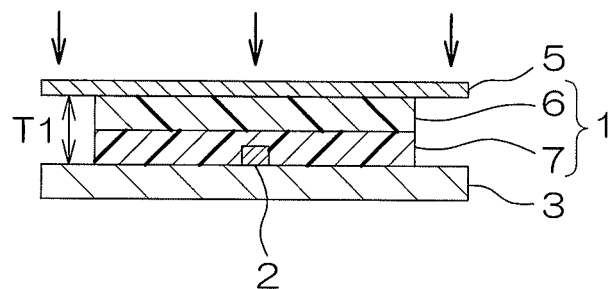
Figure 5C:
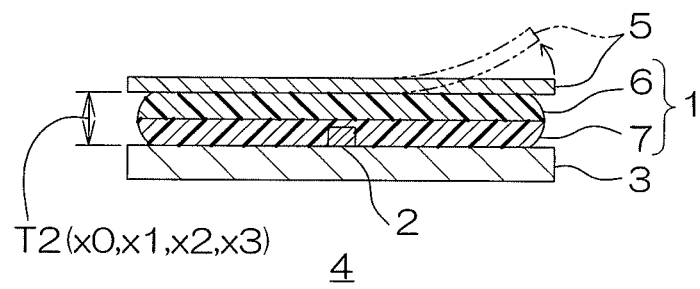

In FIG. 5, the same reference numerals are provided for members and steps corresponding to each of those in the first embodiment, and their detailed description is omitted.

In the third embodiment, as shown in FIG. 5 (a), the phosphor layer 1 is configured from a plurality of the phosphor layers that are different from each other. To be specific, the phosphor layer 1 includes a first phosphor layer 6 and a second phosphor layer 7.

The first phosphor layer 6 is laminated on the release layer 5 and serves as the outer-most layer (a cover layer) in the LED device 4. In a phosphor resin composition that forms the first phosphor layer 6, as a curable resin, preferably, a one-step curable type silicone resin is used, or more preferably, the ERASTOSIL series is used. The content proportion of the phosphor contained in the first phosphor layer 6 is, for example, set higher than the content proportion of the phosphor contained in the second phosphor layer 7. To be specific, the content ratio of the phosphor contained in the first phosphor layer 6 with respect to the total amount of the phosphor contained in the first phosphor layer 6 and the second phosphor layer 7 is, for example, above 50 mass %, preferably 55 mass % or more, or more preferably 60 mass % or more, and is, for example, 90 mass % or less, or preferably 80 mass % or less.

The second phosphor layer 7 is laminated on the surface of the first phosphor layer 6 and serves as an embedding layer that embeds the LED 2. In a phosphor resin composition that forms the second phosphor layer 7, as a curable resin, preferably, a two-step curable type silicone resin is used. The content proportion of the phosphor contained in the second phosphor layer 7 is, for example, set lower than the content proportion of the phosphor contained in the first phosphor layer 6. To be specific, the content ratio of the phosphor contained in the second phosphor layer 7 with respect to the total amount of the phosphor contained in the first phosphor layer 6 and the second phosphor layer 7 is, for example, less than 50 mass %, preferably 45 mass % or less, or more preferably 60 mass % or less, and is, for example, 10 mass % or more, or preferably 20 mass % or more.

In order to fabricate the phosphor layer 1, as shown in FIG. 5 (a), the first phosphor layer 6 is formed on the surface of the release layer 5 and subsequently, the second phosphor layer 7 is laminated on the surface of the first phosphor layer 6. To be specific, the first phosphor layer 6 and/or the second phosphor layer 7 are/is formed from a phosphor resin composition containing a curable resin before complete curing.

The thickness of the first phosphor layer 6 before complete curing is, for example, 30 μm or more, preferably 100 μm or more, or more preferably 300 μm or more, and is, for example, 1000 μm or less, preferably 700 μm or less, or more preferably 600 μm or less. The thickness of the second phosphor layer 7 before complete curing is, for example, 30 μm or more, preferably 200 μm or more, or more preferably 400 μm or more, and is, for example, 2000 μm or less, preferably 1000 μm or less, or more preferably 800 μm or less.

The thickness T1 of the phosphor layer 1 before complete curing, that is, the total thickness T1 of the first phosphor layer 6 and the second phosphor layer 7 before complete curing is, for example, 400 μm or more, or preferably 600 μm or more, and is 1500 μm or less, or preferably 1200 μm or less.

Thereafter, as shown in FIG. 5 (b), the LED 2 is covered with and encapsulated by the phosphor layer 1 including the first phosphor layer 6 and the second phosphor layer 7 in the same manner as that in the first embodiment, and the disposing step is performed.

Thereafter, as shown in FIG. 5 (c), the calibration curve preparation step, the calibration curve production step, and the adjusting step that are the same as those in the first embodiment are performed. Thereafter, as shown by the phantom line in FIG. 5 (c), the release layer 5 is peeled from the phosphor layer 1, so that the LED device 4 is obtained.

In this method, the same function and effect as that in the first embodiment can be achieved.

Modified Example

In the third embodiment, the content proportion of the phosphor contained in the first phosphor layer 6 is set higher than the content proportion of the phosphor contained in the second phosphor layer 7. Alternatively, for example, the content proportion thereof is capable of being oppositely set in accordance with its use and purpose.

Figure 6A:
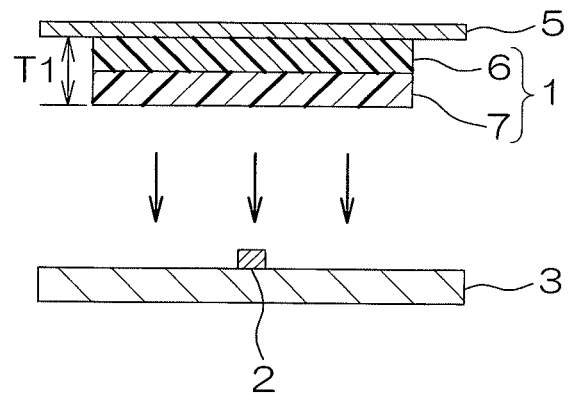
FIG. 6 shows process drawings for illustrating a modified example of the third embodiment.
Figure 6B:
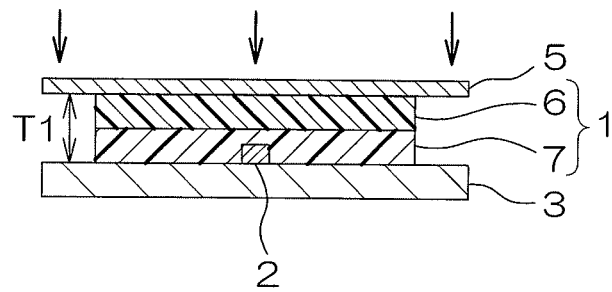
Figure 6C:
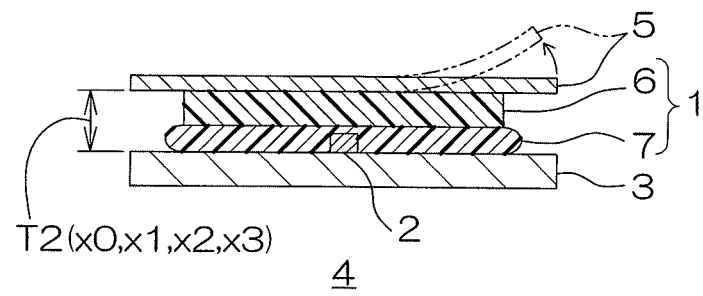

Furthermore, as referred in FIG. 6, the phosphor layer 1 is capable of being formed of the first phosphor layer 6 in a C-stage state and the second phosphor layer 7 in a B-stage state.

In such a case, when the first phosphor layer 6 is prepared from a silicone resin, for example, a commercially available product can be used. To be specific, as the one-step curable type silicone resin, a silicone elastomer such as the ELASTOSIL series including ERASTOSIL LR 7665 (manufactured by Wacker Asahikasei Silicone Co., Ltd.) can be used.

Fourth Embodiment

Figure 7A:
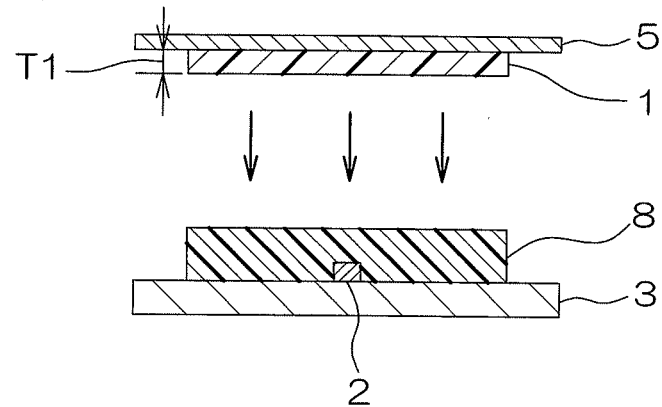
FIG. 7 shows process drawings for illustrating a fourth embodiment of a method for producing a phosphor layer-covered optical semiconductor element and an optical semiconductor device of the present invention.
Figure 7B:
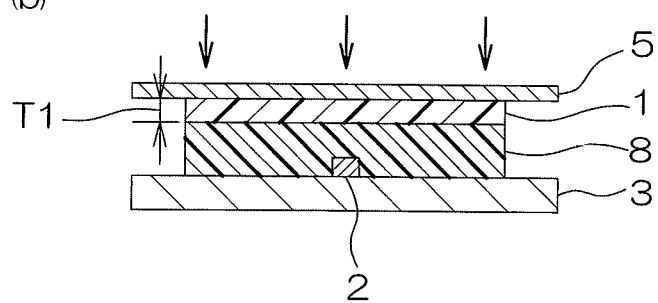
Figure 7C:
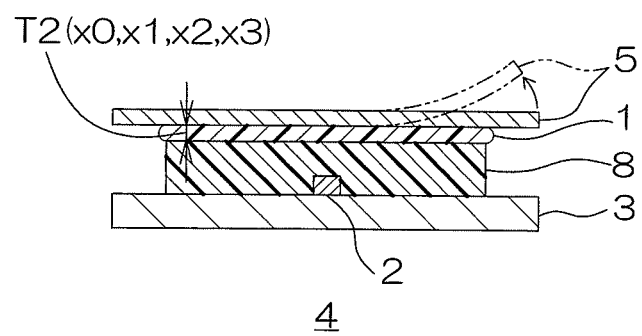

In FIG. 7, the same reference numerals are provided for members and steps corresponding to each of those in the first embodiment, and their detailed description is omitted.

In the first to third embodiments, the LED 2 is embedded by the phosphor layer 1. Alternatively, for example, as shown in FIG. 7, as long as the phosphor layer 1 is opposed to the LED 2, the LED 2 is also capable of being embedded and encapsulated by an encapsulating layer 8 and the phosphor layer 1 is capable of being disposed on the surface of the encapsulating layer 8.

In this method, the LED 2 that is mounted on the board 3 is covered with and encapsulated by the encapsulating layer 8 in advance.

The encapsulating layer 8 is formed from an encapsulating resin composition containing the same curable resin as that in the above-described phosphor resin composition. The encapsulating resin composition can also contain a phosphor and/or a filler at an appropriate proportion as required.

In order to encapsulate the phosphor layer 1 by the encapsulating layer 8, first, the encapsulating layer 8 before complete curing (to be specific, in a B-stage state) is prepared and disposed on the board 3 so as to embed the LED 2. Thereafter, the encapsulating layer 8 is completely cured.

The thickness of the encapsulating layer 8 is, for example, 300 μm or more, or preferably 400 μm or more, and is 1500 μm or less, or preferably 1200 μm or less.

[Disposing Step]

Thereafter, the phosphor layer 1 is laminated on the surface of the encapsulating layer 8. To be specific, the phosphor layer 1 before complete curing (to be specific, in a B-stage state) is disposed on the surface of the encapsulating layer 8. That is, the phosphor layer 1 is disposed in opposed relation to the LED 2 via the encapsulating layer 8 in the up-down direction.

[Adjusting Step]

After the disposing step, the thickness T1 of the phosphor layer 1 is adjusted to the set thickness x0 that corresponds to the color tone y0 to be aimed at.

That is, to be specific, by the hot pressing in which the phosphor layer 1 is pressed toward the encapsulating layer 8, the thickness T1 of the phosphor layer 1 is adjusted to the thickness T2 and at the same time, the phosphor layer 1 is completely cured.

Thereafter, as shown in FIG. 7 (c), the release layer 5 is peeled from the phosphor layer 1.

In this way, the LED device 4 including the LED 2, the board 3, the encapsulating layer 8, and the release layer 5 is obtained.

In the method for producing the LED device 4, the same function and effect as that in the above-described first embodiment can be achieved.

Modified Example

The phosphor layer 1 and the encapsulating layer 8 are also capable of being prepared as an integrated sheet in a B-stage state. In such a case, in the thickness adjustment of the phosphor layer 1 and the encapsulating layer 8, both layers are pressed, so that the color tone is capable of being adjusted.

Furthermore, in the LED device 4, a diffused layer, a brightness-improving layer, or a lens layer are capable of being provided, in addition to the encapsulating layer 8.

In the above-described embodiments, the LED 2, the phosphor layer-covered LED 10, and the LED device 4 are described as one example of the optical semiconductor element, the phosphor sheet-covered optical semiconductor element, and the optical semiconductor device of the present invention, respectively. Alternatively, for example, the optical semiconductor element, the phosphor sheet-covered optical semiconductor element, and the optical semiconductor device of the present invention can also include an LD (laser diode) 2, a phosphor layer-covered LD 10, and a laser diode device 4, respectively.

Examples

While the present invention will be described hereinafter in further detail with reference to Synthesis Examples, Production Examples, Reference Examples, Calibration Curve Production Examples, Examples, and Comparative Examples, the present invention is not limited to these Synthesis Examples, Production Examples, Reference Examples, Calibration Curve Production Examples, Examples, and Comparative Examples.

Synthesis Example 1

Synthesis of Condensation Reaction and Addition Reaction Curable Type Silicone Resin As an ethylenically unsaturated hydrocarbon group-containing silicon compound, 15.76 g (0.106 mol) of a vinyltrimethoxysilane [a compound in which $R^2$ is a vinyl group and all of the $X^1$s are methoxy groups in the following formula (II)] and as an epoxy group-containing silicon compound, 2.80 g (0.0118 mol) [the ratio $[SiOH/(SiX^1+SiX^2)=1/1]$ of the number of moles of the SiOH group in the polydimethylsiloxane containing silanol groups at both ends to the total number of moles of the $SiX^1$ group in the ethylenically unsaturated hydrocarbon group-containing silicon compound and the $SiX^2$ group in the epoxy group-containing silicon compound] of a (3-glycidoxypropyl)trimethoxysilane [a compound in which $R^3$ is a 3-glycidoxypropyl group and all of the $X^2$s are methoxy groups in the following formula (III)] were stirred and mixed into 2031 g (0.177 mol) of a polydimethylsiloxane containing silanol groups at both ends [a polysiloxane containing silanol groups at both ends in which all of the $R^1$s are methyl groups and "n"=155 in the following formula (I), a number average molecular weight of 11,500] that was heated at 40° C. Thereafter, as a condensation catalyst, 0.97 mL (an amount of catalyst: 0.88 mol, 0.50 mol with respect to 100 mol of the polydimethylsiloxane containing silanol groups at both ends) of a methanol solution (a concentration of 10 weight %) of a tetramethylammonium hydroxide was added thereto to be stirred at 40° C. for 1 hour, so that an oil was obtained. The obtained oil was stirred under a reduced pressure (10 mmHg) at 40° C. for 1 hour and a volatile component was removed. Next, the pressure of the reaction liquid was brought back to a normal pressure and then, an organohydrogenpolysiloxane (manufactured by Shin-Etsu Chemical Co., Ltd., a dimethylpolysiloxane-co-methylhydrogenpolysiloxane, an average molecular weight of 2,000, a hydrosilyl group equivalent of 7.14 mmol/g) was added thereto to be stirred at 40° C. for 1 hour.

The molar ratio ($CH_2$=CH—/SiH) of the vinyl group ($CH_2$=CH—) in the vinyltrimethoxysilane to the hydrosilyl group (SiH group) in the organohydrogenpolysiloxane was 1/3.0.

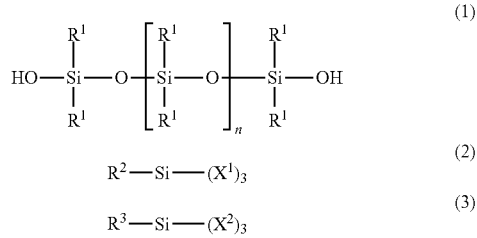

Thereafter, as a hydrosilylation catalyst, 0.038 mL (the platinum content of 0.375 ppm with respect to the organohydrogenpolysiloxane on the mass basis) of a platinum carbonyl complex (a platinum concentration of 2 weight %) was added to obtained mixture to be stirred at 40° C. for 10 minutes. In this way, a condensation reaction and addition reaction curable type silicone resin in a B-stage state was obtained.

Production Example 1

Production of Phosphor Layer in B-Stage State 20 g of TOSPEARL 2000B (silicone particles, a sphere shape, an average particle size: 6 μm, manufactured by Momentive Performance Materials Inc.) and 10 g of a phosphor were mixed into 70 g of the condensation reaction and addition reaction curable type silicone resin in Synthesis Example 1 to be then defoamed, so that a phosphor resin composition was prepared. As the phosphor, an orthosilicate having a composition of $(Ba, Sr, Ca)_2SiO_4:Eu$; in a sphere shape; having a particle size of 8 to 14 μm in d50; having a peak wavelength of 565 nm; and having an excitation wavelength of 465 nm was used.

Next, the phosphor resin composition was applied to the surface of a PET substrate (SS4C, a release layer, a thickness of 50 μm) that was subjected to a fluorine treatment with an applicator so that the thickness thereof after heating was 950 μm and in this way, a film was formed. Thereafter, the film was heated (baked) at 135° C. for 15 minutes, so that a phosphor layer in a B-stage state was obtained. The compressive elastic modulus of the obtained phosphor layer in a B-stage state was 0.05 MPa (at 25° C.).

Reference Example 1

The phosphor layer in a B-stage state in Production Example 1 that was cut into a size of 6 mm square was temporarily attached to a board in which four pieces of LEDs each having a dominant wavelength of 457.3 nm were disposed and mounted by a wire-bonding connection using a spacer having a thickness of 950 μm at a room temperature (25° C.) by a vacuum pressing. In the temporary attachment, the phosphor layer was placed on the board including the LEDs and a laminate sheet composed of those was floated with a sponge in a vacuum chamber to be subjected to vacuum drawing for 120 seconds. Thereafter, an upper press plate was lowered to be retained for 40 seconds. Thereafter, the vacuum was released and an encapsulated sample was taken out.

After the temporary attachment, the upper side and the lower side of the encapsulated sample were sandwiched between smooth plates (auxiliary plates) made of stainless steel using a spacer having a thickness of 850 μm and the resulting product was baked at 150° C. for 5 hours in an oven in a state of being fixed with a jig, so that the phosphor layer was cured. Thereafter, the substrate was peeled from the phosphor layer. The height (thickness) of the phosphor layer of the obtained package (an LED device) was 800 μm. The color tone of the total luminous flux of the package was y=0.33.

The color tone of the package was measured as a chromaticity (CIE-y) by being allowed to light up at 40 mA with an instantaneous multiple photometric system (MCPD-9800, manufactured by OTSUKA ELECTRONICS CO., LTD.). The color tone of the package to be described later was also measured in the same manner.

Calibration Curve Production Example 1

The phosphor layers in a B-stage state in Production Example 1, each of which was cut into a size of 6 mm square, were temporarily attached to two pieces of boards in which four pieces of LEDs (chips) each having a dominant wavelength of 451.9 nm were disposed and mounted by a wire-bonding connection in the same manner as described above at a room temperature (25° C.). Thereafter, using a spacer having a thickness of 850 μm and a spacer having a thickness of 660 μm, the resulting products were baked at 150° C. for 5 hours in an oven in a state of being sandwiched between the plates in the same manner as described above, so that the phosphor layers were cured. The height (thickness) of each of the phosphor layers of the obtained packages (the LED devices) after peeling the substrates from the phosphor layers was 800 μm and 610 μm. The color tones thereof at the time were y=0.345 and y=0.325.

By this result, a straight line of $Y=1.0526\times10^{-4}X+0.2607$ was obtained as a calibration curve. Subsequently, in the LED having a dominant wavelength of 451.9 nm, it was estimated that the optimal height (thickness) X of the phosphor layer on being adjusted to the color tone: y=0.33 to be aimed at was 657.5 μm (ref: FIG. 2).

Calibration Curve Production Example 2

The phosphor layers in a B-stage state in Production Example 1, each of which was cut into a size of 6 mm square, were temporarily attached to three pieces of boards in which four pieces of LEDs (chips) each having a dominant wavelength of 446.3 nm were disposed and mounted by a wire-bonding connection in the same manner as described above at a room temperature (25° C.). Thereafter, using a spacer having a thickness of 850 μm, a spacer having a thickness of 660 μm, and a spacer having a thickness of 480 μm, the resulting products were baked at 150° C. for 5 hours in an oven in a state of being sandwiched between the plates in the same manner as described above, so that the phosphor layers were cured. The height (thickness) of each of the phosphor layers of the obtained packages (the LED devices) after peeling the substrates from the phosphor layers was 800 μm, 610 μm, and 430 μm. The color tones thereof at the time were y=0.37, y=0.342, and y=0.31.

By this result, a first approximate straight line of $Y=1.6202 \times 10^{-4} X+0.2412$ was obtained as a calibration curve. Subsequently, in the LED having a dominant wavelength of 446.3 nm, it was estimated that the optimal height (thickness) of the phosphor layer on being adjusted to the color tone: y=0.33 to be aimed at was 547.7 μm (ref: FIG. 3).

Example 1

The phosphor layer in a B-stage state in Production Example 1 that was cut into a size of 6 mm square was temporarily attached to a board in which four pieces of LEDs (chips) each having a dominant wavelength of 451.9 nm were disposed and mounted by a wire-bonding connection in the same manner as described above at a room temperature (25° C.) in a vacuum using a spacer having a thickness of 950 μm. Next, using a spacer having a thickness of 707.5 μm, the resulting product was baked at 150° C. for 5 hours in an oven in a state of being sandwiched between the plates, so that the thickness of the phosphor layer was adjusted and the phosphor layer was cured. The height (thickness) of the obtained phosphor layer was 657.5 μm. The color tone thereof was y=0.33. That is, the color tone to be aimed at was capable of being obtained.

Example 2

The phosphor layer in a B-stage state in Production Example 1 that was cut into a size of 6 mm square was temporarily attached to a board in which four pieces of LEDs (chips) each having a dominant wavelength of 446.3 nm were disposed and mounted by a wire-bonding connection in the same manner as described above at a room temperature (25° C.) in a vacuum using a spacer having a thickness of 950 μm. Next, using a spacer having a thickness of 597.7 μm, the resulting product was baked at 150° C. for 5 hours in an oven in a state of being sandwiched between the plates, so that the thickness of the phosphor layer was adjusted and the phosphor layer was cured. The height (thickness) of the obtained phosphor layer was 547.7 μm. The color tone thereof was y=0.33. That is, the color tone to be aimed at was capable of being obtained.

Comparative Example 1

The steps were processed in the same manner as in Reference Example 1, except that the phosphor layer in a B-stage state in Production Example 1 that was cut into a size of 6 mm square was temporarily attached to a board in which four pieces of LEDs (chips) each having a dominant wavelength of 451.9 nm were disposed and mounted by a wire-bonding connection at a room temperature (25° C.) in a vacuum using a spacer having a thickness of 950 μm, and a spacer having a thickness of 850 μm was used as a spacer in baking with an oven. As a result, as shown in the following, the color tone was deviated from the color tone: y=0.33 to be aimed at.

The measured color tone: y=0.345
The color tone to be aimed at: y=0.33

Comparative Example 2

The steps were processed in the same manner as in Reference Example 1, except that the phosphor layer in a B-stage state in Production Example 1 that was cut into a size of 6 mm square was temporarily attached to a board in which four pieces of LEDs (chips) each having a dominant wavelength of 446.3 nm were disposed and mounted by a wire-bonding connection at a room temperature (25° C.) in a vacuum using a spacer having a thickness of 950 μm, and a spacer having a thickness of 850 μm was used as a spacer in baking with an oven. As a result, as shown in the following, the color tone was deviated from the color tone: y=0.33 to be aimed at.

The measured color tone: y=0.37
The color tone to be aimed at: y=0.33

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method for producing a phosphor layer-covered optical semiconductor element comprising:
    a step of opposing a phosphor layer containing a phosphor to an optical semiconductor element;
    an adjusting step of adjusting a color tone of light emitted from the optical semiconductor element and exited via the phosphor layer by adjusting the thickness of the phosphor layer;
    a calibration curve preparation step including:
        a first measurement step of measuring a thickness of a first reference phosphor layer at the time of opposing the first reference phosphor layer that is the same as the phosphor layer to the optical semiconductor element and a color tone of light emitted from the optical semiconductor element and exited via the first reference phosphor layer; and
        a second measurement step of measuring a thickness of a second reference phosphor layer at the time of opposing the second reference phosphor layer that is the same as the phosphor layer to the optical semiconductor element so that the thickness thereof is different from that of the first reference phosphor layer and a color tone of light emitted from the optical semiconductor element and exited via the second reference phosphor layer; and
    a calibration curve production step of producing a calibration curve based on the thickness and the color tone of the light obtained from the calibration curve preparation step,
    wherein, in the adjusting step, the thickness of the phosphor layer that corresponds to the color tone to be aimed at is obtained based on the calibration curve and subsequently, the thickness of the phosphor layer is adjusted so as to have the thickness.

2. The method for producing a phosphor layer-covered optical semiconductor element according to claim 1, wherein the adjusting step includes a pressing step of pressing at least one of the phosphor layer and the optical semiconductor element that are opposed to each other toward a direction in which the phosphor layer and the optical semiconductor element are close to each other.

3. The method for producing a phosphor layer-covered optical semiconductor element according to claim 2, wherein
   the phosphor layer is formed from a thermosetting resin and
   in the pressing step, the phosphor layer formed from the thermosetting resin is heated to be thermally cured.

4. The method for producing a phosphor layer-covered optical semiconductor element according to claim 1, wherein the calibration curve preparation step further includes a third measurement step of measuring a thickness of a third reference phosphor layer at the time of opposing the third reference phosphor layer that is the same as the phosphor layer to the optical semiconductor element so that the thickness thereof is different from that of the first reference phosphor layer and the second reference phosphor layer and a color tone of light emitted from the optical semiconductor element and exited via the third reference phosphor layer.

* * * * *